US012573593B2

(12) United States Patent
Hirota et al.

(10) Patent No.: US 12,573,593 B2
(45) Date of Patent: Mar. 10, 2026

(54) PLASMA PROCESSING METHOD

(71) Applicant: Hitachi High-Tech Corporation, Tokyo (JP)

(72) Inventors: Kosa Hirota, Tokyo (JP); Masahiro Sumiya, Tokyo (JP); Hirofumi Eitoku, Tokyo (JP); Takanori Nakatsuka, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/278,372

(22) PCT Filed: Feb. 10, 2020

(86) PCT No.: PCT/JP2020/005127
§ 371 (c)(1),
(2) Date: Mar. 22, 2021

(87) PCT Pub. No.: WO2021/161384
PCT Pub. Date: Aug. 19, 2021

(65) Prior Publication Data
US 2022/0375726 A1 Nov. 24, 2022

(51) Int. Cl.
*H01J 37/32* (2006.01)
*H01L 21/3065* (2006.01)

(52) U.S. Cl.
CPC .. *H01J 37/32477* (2013.01); *H01J 37/32449* (2013.01); *H01J 37/32862* (2013.01); *H01J 2237/334* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 6,815,362 | B1 | 11/2004 | Wong et al. |
| 7,204,913 | B1 | 4/2007 | Singh et al. |
| 7,767,584 | B1 | 8/2010 | Singh et al. |
| 8,557,709 | B2 | 10/2013 | Sumiya et al. |
| 8,767,166 | B2 | 7/2014 | Kubota et al. |
| 10,923,360 | B2 | 2/2021 | Katsunuma |
| 11,664,236 | B2 | 5/2023 | Katsunuma |

(Continued)

FOREIGN PATENT DOCUMENTS

| | | |
|---|---|---|
| JP | H06-116632 A | 4/1994 |
| JP | H09-171999 A | 6/1997 |

(Continued)

OTHER PUBLICATIONS

Office Action mailed Mar. 14, 2022 in Korean Application No. 10-2021-7001574.

(Continued)

*Primary Examiner* — Stephanie P Duclair
(74) *Attorney, Agent, or Firm* — Miles & Stockbridge, P.C.

(57) ABSTRACT

A plasma processing method which can realize a reduction of process variation in the first one of lot processing includes a first step of supplying gas to a processing chamber and a second step of etching the sample by using plasma after the first step. The gas is a gas containing a carbon element and a hydrogen element, a gas containing a chlorine element, or a mixed gas containing all of the gases used in the second step.

8 Claims, 11 Drawing Sheets

NEXT LOT PROCESSING

FLOW OF REFERENCE EXAMPLE

LOT PRE-PROCESSING STEP
(HEATING STEP S201 + FIRST CLEANING STEP S202 + FIRST COATING STEP S203)

PRODUCT ETCHING STEP S204

METAL CLEANING STEP S205 + SECOND CLEANING STEP S206 + SECOND COATING STEP S207

POST CLEANING STEP S208 x25

(56) References Cited

U.S. PATENT DOCUMENTS

| | | | |
|---|---|---|---|
| 2002/0155714 A1* | 10/2002 | Suzuki | H01J 37/32192 |
| | | | 438/689 |
| 2003/0005943 A1 | 1/2003 | Singh et al. | |
| 2004/0014327 A1 | 1/2004 | Ji et al. | |
| 2004/0235303 A1 | 11/2004 | Wong et al. | |
| 2005/0118809 A1 | 6/2005 | Noguchi et al. | |
| 2005/0215062 A1* | 9/2005 | Miyagawa | H01L 21/31122 |
| | | | 257/E21.252 |
| 2006/0275931 A1 | 12/2006 | Takizawa et al. | |
| 2007/0004189 A1 | 1/2007 | Noguchi et al. | |
| 2009/0277872 A1 | 11/2009 | Yamamoto et al. | |
| 2010/0159704 A1* | 6/2010 | Hirota | H01J 37/32972 |
| | | | 257/E21.218 |
| 2011/0114130 A1 | 5/2011 | Kang et al. | |
| 2011/0226734 A1* | 9/2011 | Sumiya | H01L 21/67259 |
| | | | 216/41 |
| 2011/0265813 A1 | 11/2011 | Okai et al. | |
| 2012/0085366 A1 | 4/2012 | Hirota | |
| 2013/0087174 A1 | 4/2013 | Sun et al. | |
| 2014/0053983 A1 | 2/2014 | Sumiya et al. | |
| 2014/0083450 A1* | 3/2014 | Ye | C11D 7/02 |
| | | | 134/1 |
| 2014/0166049 A1 | 6/2014 | Kang et al. | |
| 2015/0000695 A1* | 1/2015 | Noda | C23C 16/4405 |
| | | | 134/4 |
| 2015/0024599 A1 | 1/2015 | Sumiya et al. | |
| 2015/0325417 A1 | 11/2015 | Lin et al. | |
| 2016/0217978 A1 | 7/2016 | Mai | |
| 2016/0379833 A1 | 12/2016 | Hong et al. | |
| 2017/0032955 A1 | 2/2017 | Sumiya et al. | |
| 2017/0040147 A1 | 2/2017 | Shih et al. | |
| 2017/0194561 A1 | 7/2017 | Suyama et al. | |
| 2018/0082855 A1 | 3/2018 | Sasaki et al. | |
| 2019/0362984 A1 | 11/2019 | Katsunuma | |
| 2020/0294777 A1 | 9/2020 | Hirota et al. | |
| 2021/0143019 A1 | 5/2021 | Katsunuma | |
| 2022/0262606 A1 | 8/2022 | Hirota et al. | |

FOREIGN PATENT DOCUMENTS

| | | | |
|---|---|---|---|
| JP | H11-40502 A | 2/1999 | |
| JP | 2002270589 A | 9/2002 | |
| JP | 2005142369 A | 6/2005 | |
| JP | 2005268292 A | 9/2005 | |
| JP | 2008060171 A | 3/2008 | |
| JP | 2009016611 A | 1/2009 | |
| JP | 2010153508 A | 7/2010 | |
| JP | 2011192872 A | 9/2011 | |
| JP | 2011249405 A | 12/2011 | |
| JP | 2012182373 A | 9/2012 | |
| JP | 2012222225 A | 11/2012 | |
| JP | 5450187 B2 | 3/2014 | |
| JP | 2014-528642 A | 10/2014 | |
| JP | 2015-008211 A | 1/2015 | |
| JP | 5750496 B2 | 7/2015 | |
| JP | 2016072264 A | 5/2016 | |
| JP | 2017010972 A * | 1/2017 | |
| JP | 2018046216 A | 3/2018 | |
| KR | 20110054287 A | 5/2011 | |
| KR | 1020180030742 A | 3/2018 | |
| TW | 200402458 A | 2/2004 | |
| TW | 201207520 A | 2/2012 | |
| TW | 2018-39847 A | 11/2018 | |
| TW | 202004911 A | 1/2020 | |

OTHER PUBLICATIONS

Office Action mailed Dec. 19, 2018 in Taiwanese Application No. 107110224.

Search Report mailed Jun. 19, 2018 in International Application No. PCT/JP2018/010697.

Office Action mailed Jul. 17, 2020 in Taiwanese Application No. 108126525.

Office Action mailed Jul. 22, 2022 in Taiwanese Application No. 110102223.

Office Action mailed Apr. 28, 2021 in U.S. Appl. No. 16/084,095.

Allowance mailed Feb. 10, 2022 in U.S. Appl. No. 16/084,095.

Office Action mailed Jun. 13, 2023 in Taiwanese Application No. 110102223.

Search Report mailed Apr. 14, 2020 in corresponding International Application No. PCT/JP2020/005127.

Written Opinion mailed Apr. 14, 2020 in corresponding International Application No. PCT/JP2020/005127.

Office Action mailed Jan. 16, 2024 in Japanese Application No. 2022-145856.

Office Action mailed Jun. 27, 2023 in Japanese Application No. 2022-145856.

Office Action mailed Aug. 28, 2024 in U.S. Appl. No. 17/736,214.

Office Action mailed Feb. 9, 2024 in U.S. Appl. No. 17/736,214.

Office Action mailed Jul. 25, 2022 in U.S. Appl. No. 15/443,578.

Office Action mailed Apr. 30, 2025 in Chinese Application No. 202080004094.3.

* cited by examiner

[FIG. 1]
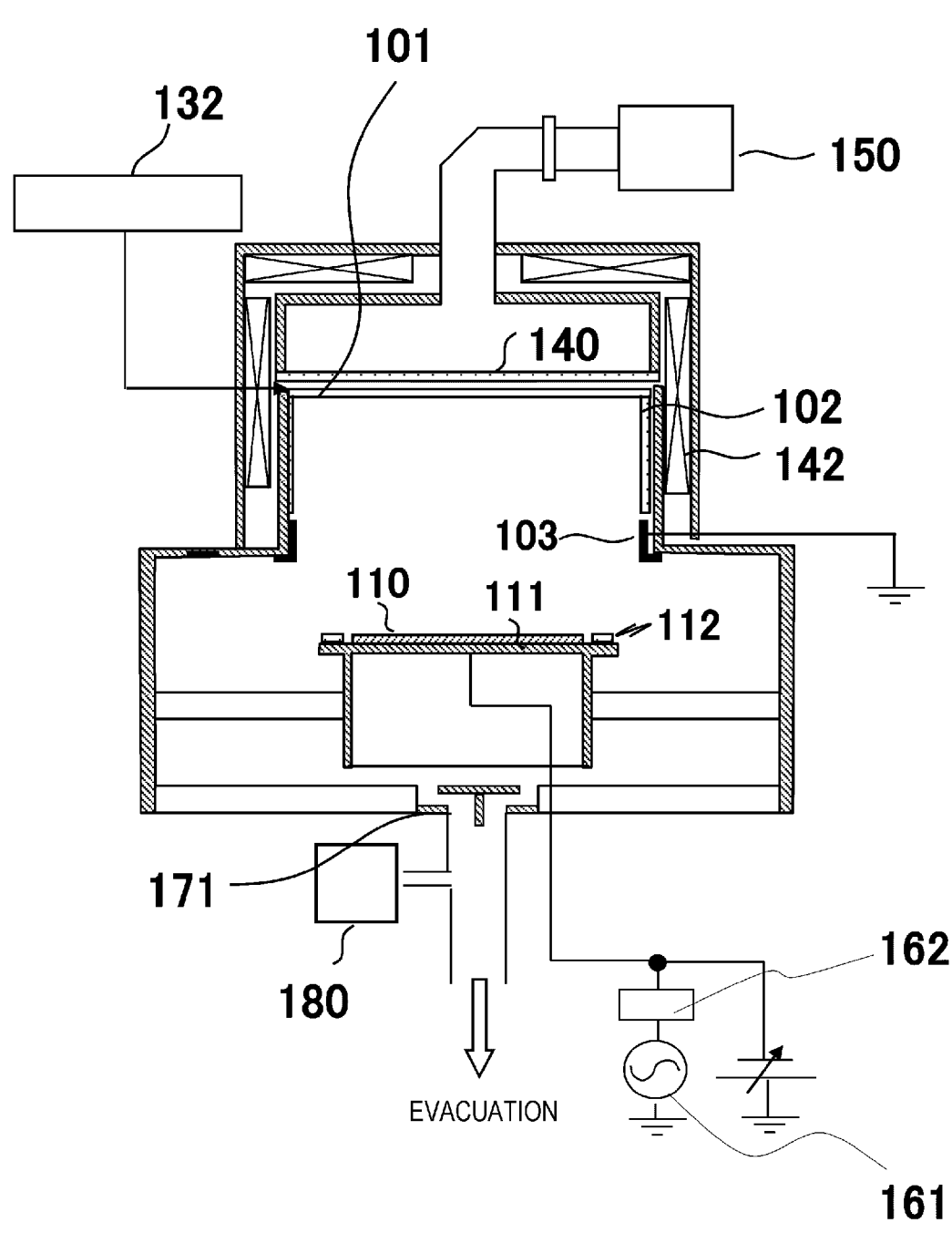

[FIG. 2]
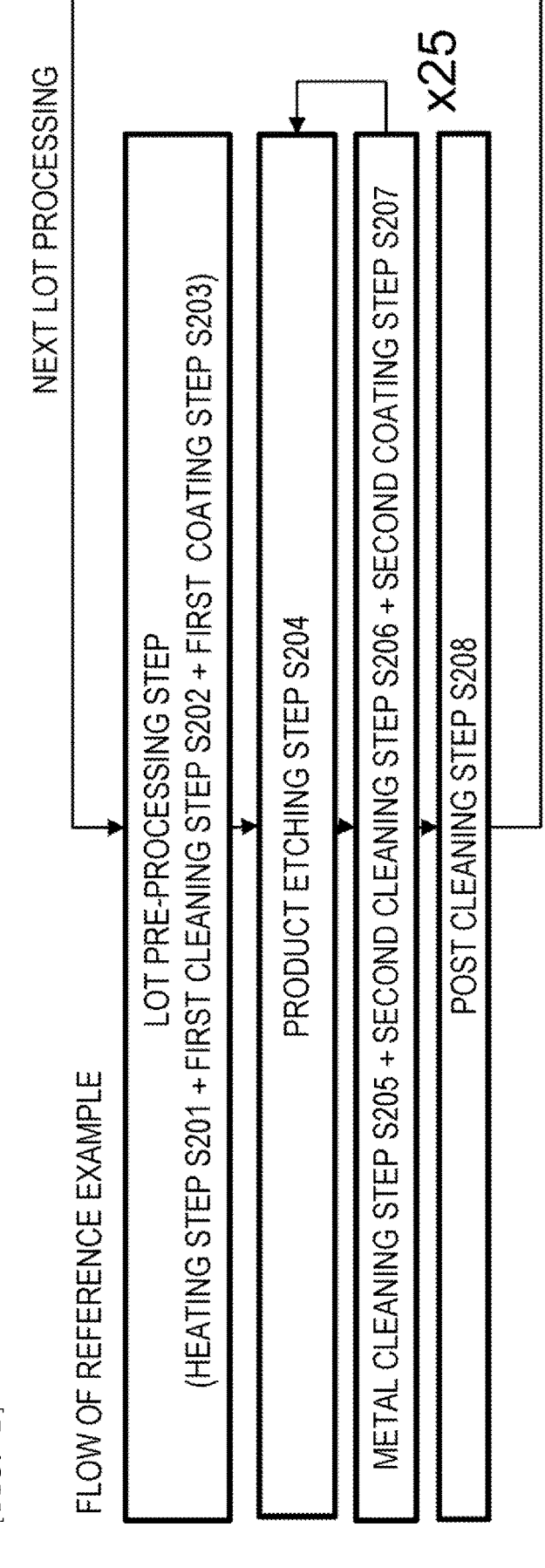

[FIG. 3]
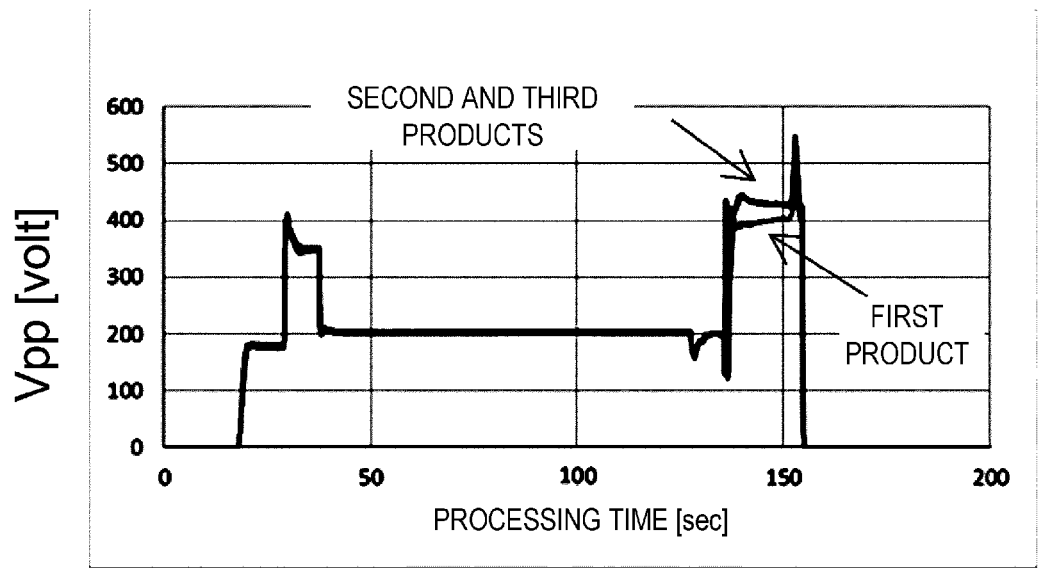

[FIG. 4]
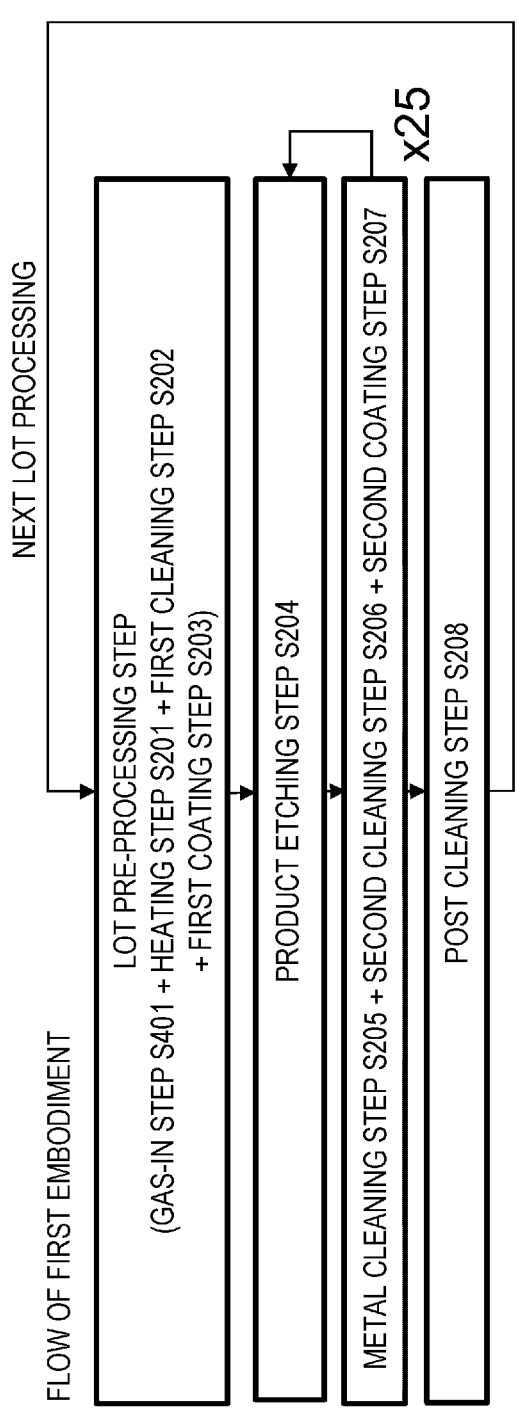
FLOW OF FIRST EMBODIMENT
NEXT LOT PROCESSING
LOT PRE-PROCESSING STEP
(GAS-IN STEP S401 + HEATING STEP S201 + FIRST CLEANING STEP S202
+ FIRST COATING STEP S203)
PRODUCT ETCHING STEP S204
METAL CLEANING STEP S205 + SECOND CLEANING STEP S206 + SECOND COATING STEP S207
x25
POST CLEANING STEP S208

[FIG. 5]
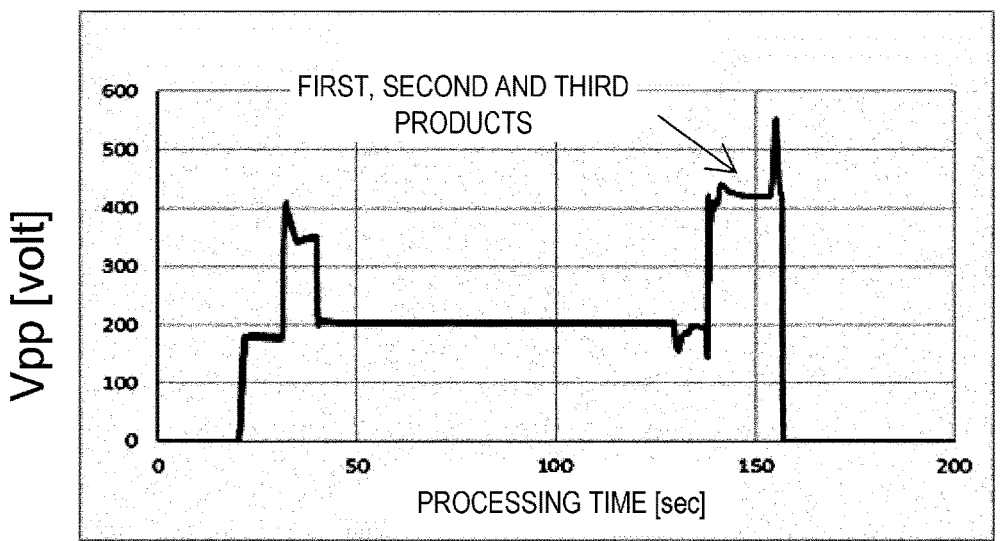
[FIG. 6A]
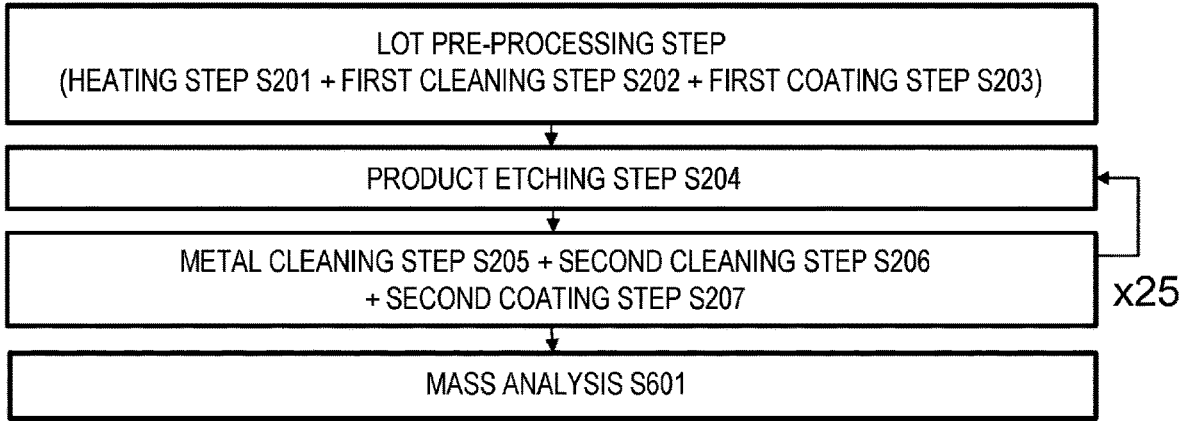
[FIG. 6B]
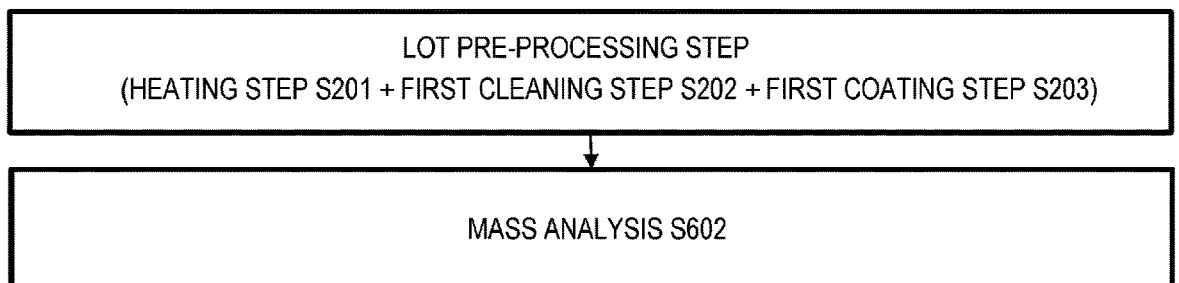

[FIG. 6C]
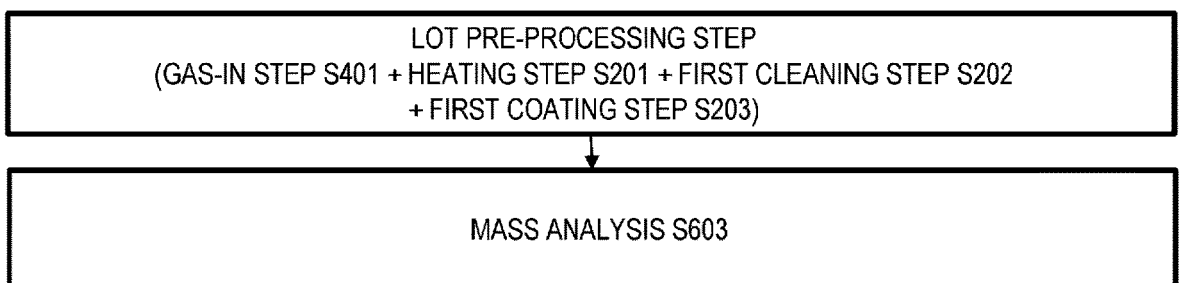
LOT PRE-PROCESSING STEP
(GAS-IN STEP S401 + HEATING STEP S201 + FIRST CLEANING STEP S202
+ FIRST COATING STEP S203)
MASS ANALYSIS S603
[FIG. 7]
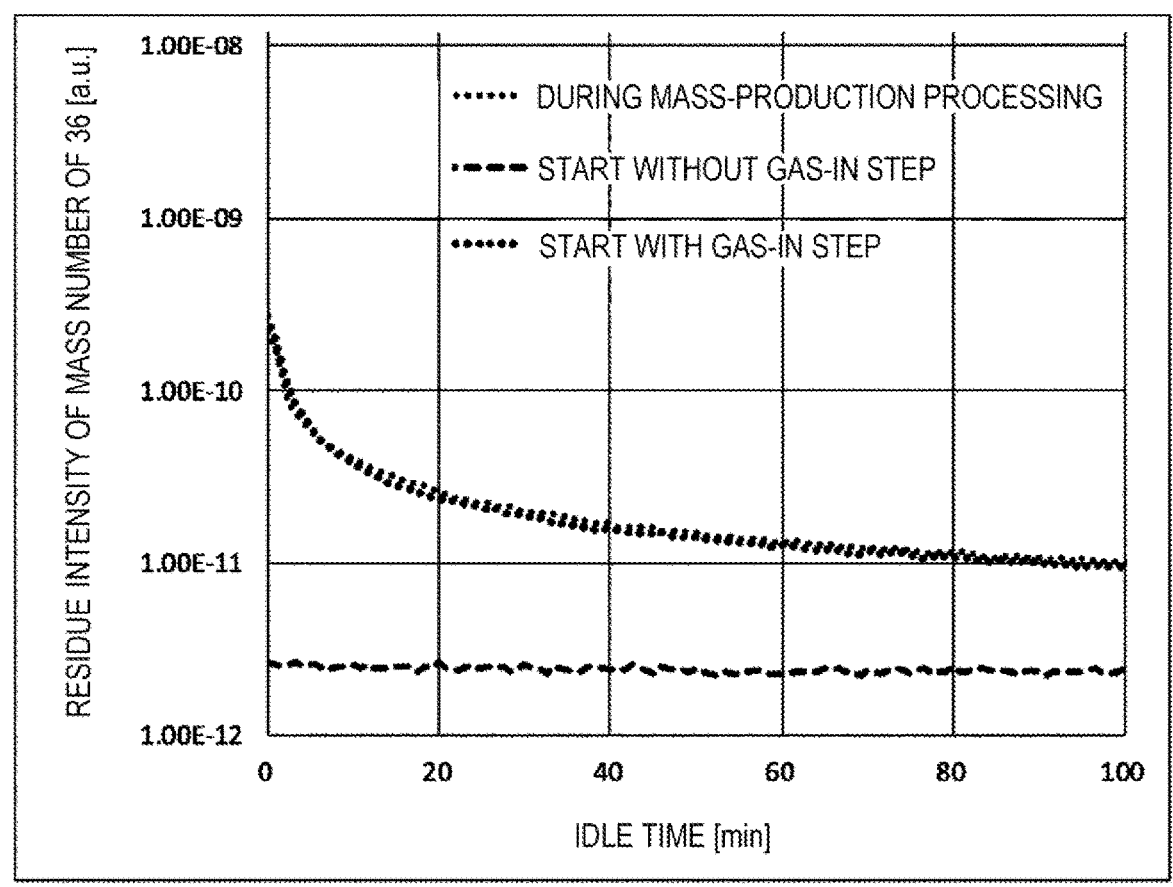

[FIG. 8A]
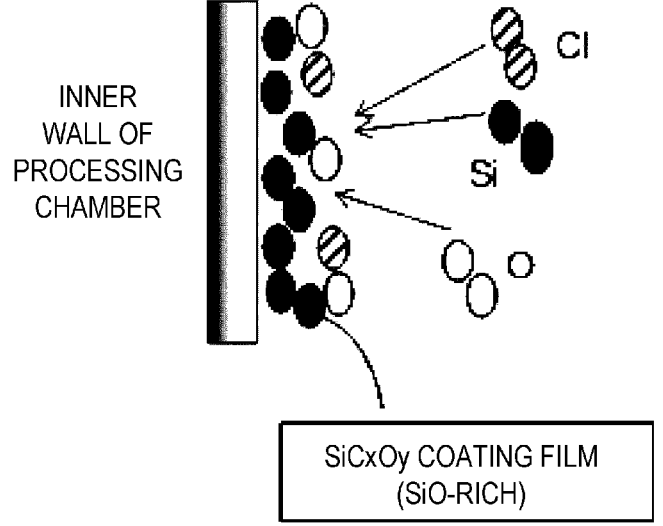
[FIG. 8B]
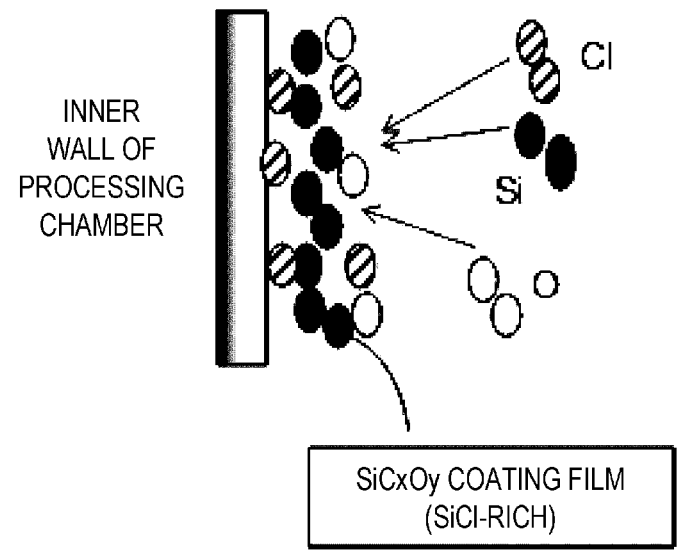

[FIG. 9]
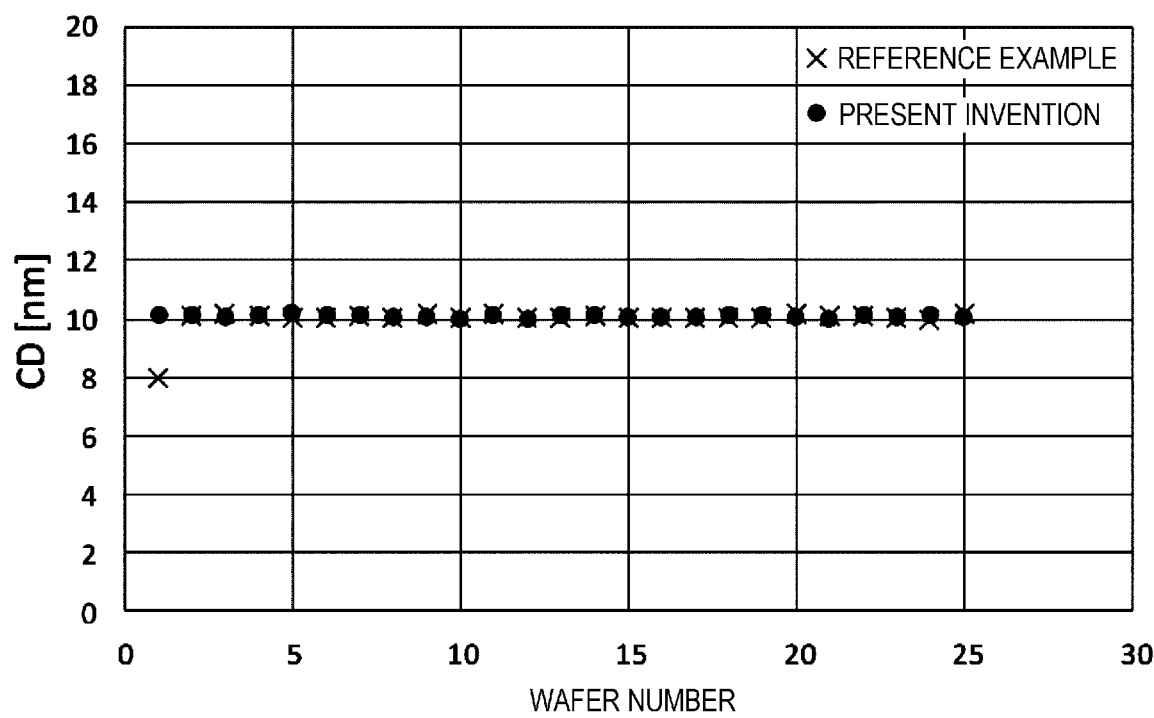

[FIG. 10]

| PRODUCT ETCHING RECIPE S1001 | | | | |
|---|---|---|---|---|
| Step | Gas flow rate (ccm) | | | |
| | Cl2 | NF3 | CH4 | Ar |
| 1 | 300 | 100 | | 50 |
| 2 | | | 10 | 250 |

↓

| RECIPE S1002 OF GAS-IN STEP (SET 10% OF MAXIMUM FLOW RATE OF EACH GAS DURING PRODUCT ETCHING RECIPE) | | | | |
|---|---|---|---|---|
| Step | Gas flow rate (ccm) | | | |
| | Cl2 | NF3 | CH4 | Ar |
| - | 30 | 10 | 1 | 25 |

| RECIPE S1003 OF GAS-IN STEP CONSIDERING MFC FLOW RATE LIMITATION | | | | |
|---|---|---|---|---|
| Step | Gas flow rate (ccm) | | | |
| | Cl2 | NF3 | CH4 | Ar |
| - | 30 | 20 | 10 | 25 |

| MFC MINIMUM FLOW RATE S1004 | | | | |
|---|---|---|---|---|
| Step | Gas flow rate (ccm) | | | |
| | Cl2 | NF3 | CH4 | Ar |
| - | 30 | 20 | 10 | 20 |

[FIG. 11]
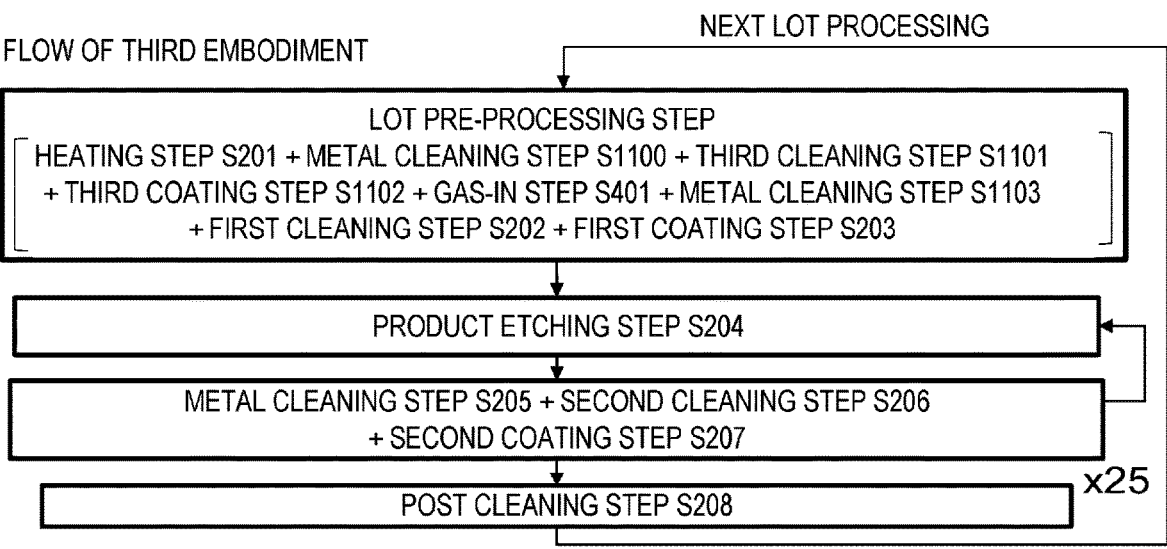
[FIG. 12A]
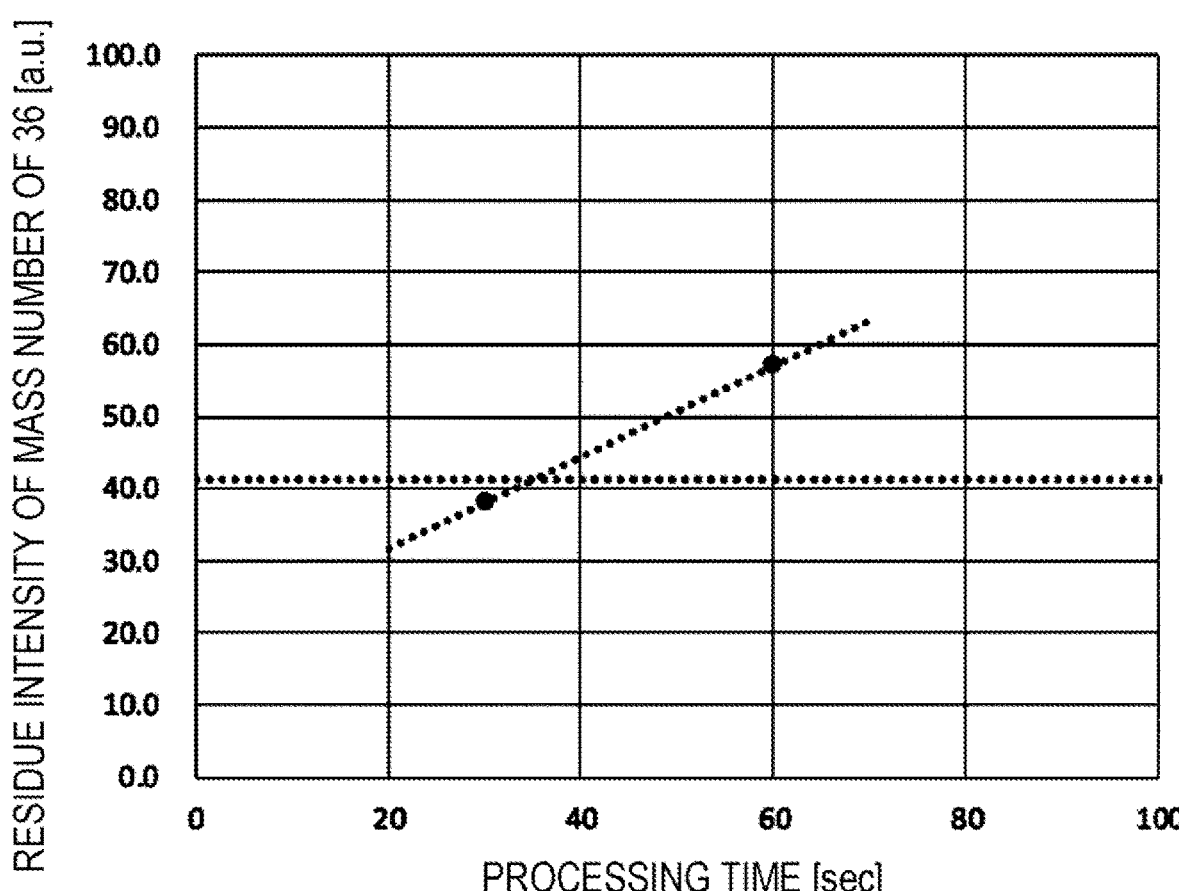

[FIG. 12B]
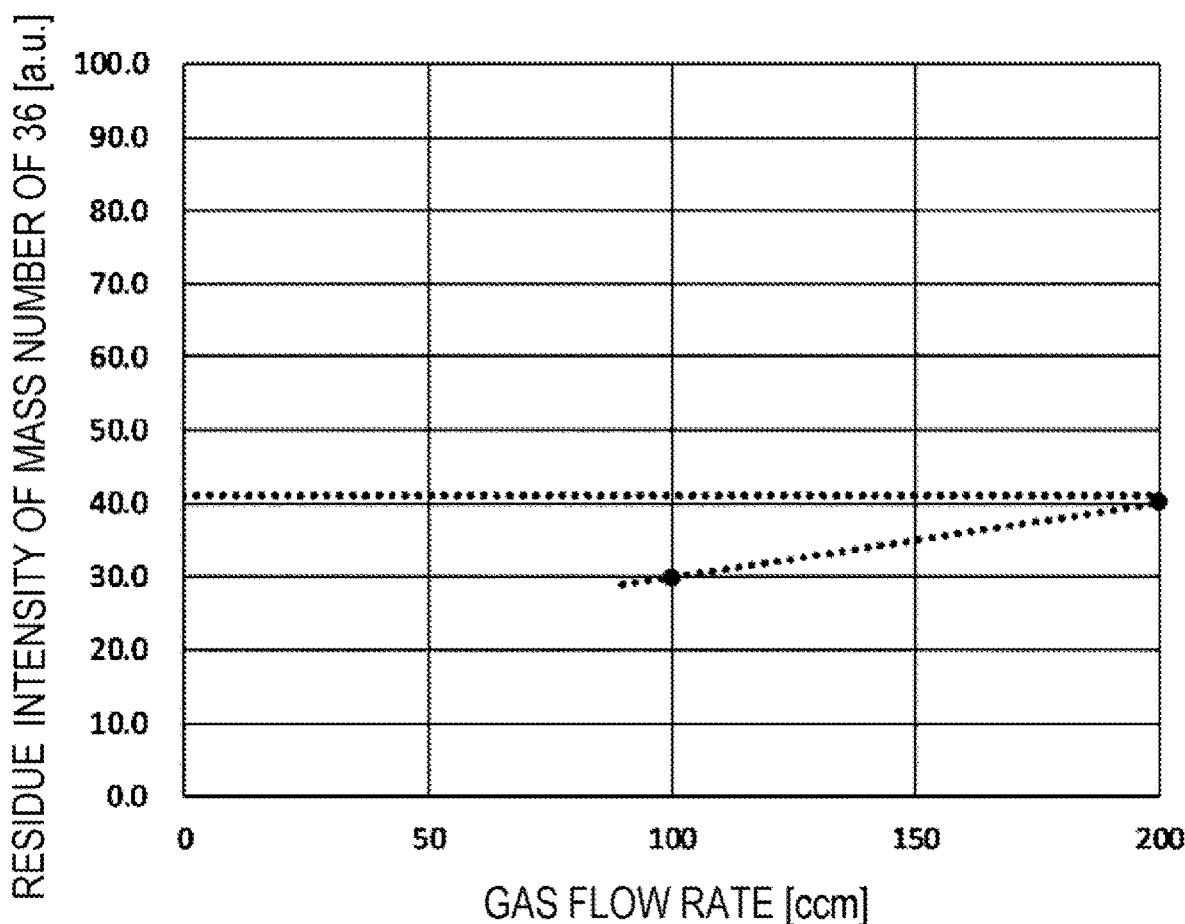

PLASMA PROCESSING METHOD

TECHNICAL FIELD

The present invention relates to a plasma processing method.

BACKGROUND ART

In a manufacturing step for a semiconductor device, it is required to cope with miniaturization and integration of components included in the semiconductor device. For example, in an integrated circuit and a nano-electromechanical system, nanoscaling of a structure is further promoted.

In general, in the manufacturing step of the semiconductor device, a lithography technique is used to form a fine pattern. In this technique, a pattern of a device structure is applied on a resist layer, and a substrate exposed by the pattern of the resist layer is selectively removed by etching. In a subsequent processing step, the integrated circuit can be formed by depositing another material in an etching region.

In particular, in recent years, with the promotion of miniaturization and three-dimensional structurization of semiconductor processing, a reduction of particles with high accuracy at an atom level and processing reproducibility are required in a mass-production plasma etching process of the semiconductor device. Further, the control of a surface state of a processing chamber is important for realizing these requirements.

The particles to be reduced are generated due to the following events. For example, if proper care is not taken for reaction products, that is, deposits on the surface of the processing chamber generated by product etching, the deposits may eventually grow and become particles that fall on a wafer. In addition, a nonvolatile surface member of a reactor processing chamber may be damaged during plasma etching to become particles, which may become particles falling on the wafer.

In order to prevent the generation of the particles, improvements for realizing high resistance and a reduction of particles of a ceramic material of a plasma etching apparatus have been studied. However, since radicals and ion energy generated by plasma are relatively large, it has been found that it is extremely difficult to not generate etching damage at all by improving the surface member of the processing chamber.

Therefore, a measure has been carried out for starting product processing after the plasma etching is used to attach Si-based and C-based deposits to the surface of the processing chamber before the product processing. This film of deposits makes it possible to protect the surface member of the processing chamber from being damaged and reduce the release of the particles.

Meanwhile, regarding the processing reproducibility, when a physicochemical state of the surface of the processing chamber varies, the surface recombination probability and consumption of radicals change on the surface of the processing chamber, and thus it is necessary to cope with the change in radical balance. For example, it has been clarified that the amount of Cl radicals in $Cl_2$ plasma differs several times depending on the presence or absence of SiClx deposits on the surface of the processing chamber. Therefore, it is important to control the amount of Cl radicals in the $Cl_2$ plasma.

In addition, the reaction rate between the radicals and the processing chamber and an attachment coefficient of deposits differ depending on a surface temperature of the processing chamber, and thus it is necessary to keep the temperature in the processing chamber constant within a lot or between lots. Therefore, in a mass-production apparatus for etching, a technique for keeping a state of an inner wall of the processing chamber constant, including the surface temperature, is required.

In addition, it is important to prevent a process variation in order to improve the processing reproducibility. In order to prevent the process variation, a technique of performing product processing followed by using the plasma etching to attach the Si-based and C-based deposits to the surface of the processing chamber before the product processing has been developed (Patent Literatures 1 and 2). This film of deposits makes it possible to always keep the surface state of the processing chamber constant for each wafer and to reduce the process variation.

Thus, in order to prevent the process variation and reduce the particles, a coating step of attaching the Si-based and C-based deposits to the inner wall of the processing chamber before the product processing is carried out. However, when idling which is a non-operating state where the product etching is not processed occurs in the plasma etching apparatus, the process variation is observed in the first one of lot processing. This is an event called a so-called first wafer effect, processing accuracy deteriorates to the outside an allowable range due to such process variation, and it is one of the factors of a decrease in the yield of the device.

CITATION LIST

Patent Literature

PTL 1: Japanese Patent No. 5450187
PTL 2: U.S. Pat. No. 7,767,584

SUMMARY OF INVENTION

Technical Problem

As described above, although a certain effect on the reduction of particles is achieved by a technique using the related-art coating step, there is a problem that the process variation of the first one of lot processing cannot be prevented. This process variation is caused by a difference in a processing chamber environment such as the surface temperature of the processing chamber and the state of deposits between a first wafer, and a second and subsequent wafers of lot processing.

In contrast, as a technique of preventing the process variation caused by the temperature of the processing chamber, there is a plasma heating technique (hereinafter, referred to as a heating step) that raises the inner wall temperature of the processing chamber to a temperature during mass-production processing by using plasma before the start of a product etching step for the first one of lot processing, and a measure such as controlling the inner wall temperature with a heater. However, as a result of extensive studies, the present inventors have found that the first wafer effect may occur due to factors other than the inner wall temperature of the processing chamber. Therefore, it is necessary to prevent the process variation by methods other than the method of controlling the inner wall temperature of the processing chamber.

The invention has been made in view of the above problems, and an aim thereof is to provide a plasma processing method that realizes a reduction of a process variation in a first one of lot processing.

Solution to Problem

In order to solve the above problem, a typical one of the plasma processing method according to the invention is a plasma processing method in which a sample is processed in a processing chamber by using plasma and the plasma processing method includes a first step of supplying gas to the processing chamber and a second step of etching the sample by using plasma after the first step, in which the gas is a gas containing a carbon element and a hydrogen element, a gas containing a chlorine element, or a mixed gas containing all of the gases used in the second step.

Advantageous Effects

According to the invention, the plasma processing method that realizes the reduction of the process variation in the first one of lot processing can be provided. Problems, configurations, and effects other than those described above will be apparent from a description of the following embodiments.

BRIEF DESCRIPTION OF DRAWINGS

FIG. 1 is a schematic cross-sectional view of a microwave ECR etching apparatus according to the present embodiment.

FIG. 2 is a diagram showing an etching processing flow shown as a reference example.

FIG. 3 is a diagram showing a relation between a wafer bias voltage (Vpp) during a product etching step obtained by the processing flow of FIG. 2 and a processing time.

FIG. 4 is a diagram showing an etching processing flow according to a first embodiment.

FIG. 5 is a diagram showing a relation between a wafer bias voltage (Vpp) during a product etching step obtained by the processing flow of FIG. 4 and the processing time.

FIG. 6A is a diagram showing an evaluation flow in which a gas remaining in a chamber is mass-analyzed by using a first processing flow.

FIG. 6B is a diagram showing an evaluation flow in which the gas remaining in the chamber is mass-analyzed by using a second processing flow.

FIG. 6C is a diagram showing an evaluation flow in which the gas remaining in the chamber is mass-analyzed by using a third processing flow.

FIG. 7 is a diagram showing a time transition of the intensity of a residue having a mass number of 36 obtained by the three types of processing flows of FIGS. 6A, 6B, and 6C.

FIG. 8A is a schematic diagram of an estimation model schematically showing a coat composition state in a coating film step caused by a change of the residue having a mass number of 36.

FIG. 8B is a schematic diagram of an estimation model schematically showing a coat composition state in the coating film step caused by the change of the residue having a mass number of 36.

FIG. 9 shows a transition of a CD value shown by the dimension of a certain line when one lot is processed in a gas-in step in the processing flow of the reference example of FIG. 2 and the processing flow of the present embodiment of FIG. 4.

FIG. 10 is an example of recipe setting in the gas-in step of the present embodiment.

FIG. 11 is a diagram showing a processing flow of another embodiment that further reduces a first wafer effect.

FIG. 12A is a diagram showing a relation between the residue having a mass number of 36 and the processing time when $Cl_2$ gas is supplied at 200 cc/min as a condition of a gas-in step S401 in the evaluation flow of FIG. 6C.

FIG. 12B is a diagram showing a relation between the residue having a mass number of 36 and a gas flow rate when $Cl_2$ gas is supplied for 30 seconds as a condition of the gas-in step S401 in the evaluation flow of FIG. 6C.

DESCRIPTION OF EMBODIMENTS

First Embodiment

As an example of an etching apparatus (plasma processing apparatus) to which embodiments of the invention are applied, a microwave electron cyclotron resonance (ECR) etching apparatus shown in FIG. 1 can be used. The etching apparatus includes an electrode 111 on which a wafer (sample) 110 as a material to be processed is placed in a processing container, a gas supply device 132, a top plate 140 and a quartz-made shower plate 101, a quartz-made inner tube 102, a ground 103, an electromagnet 142, a radio frequency waveguide 150 that generates plasma, a RF bias power supply 161 and a matching machine 162, and a vacuum exhaust valve 171 in a processing chamber. In the present embodiment, RF biasing is controlled by fixing power. The etching apparatus of the present embodiment can perform a plasma etching step of exciting particles such as atoms or molecules of a processing gas into plasma by using a microwave electric field introduced into the processing chamber formed inside the processing container, and then etching a film structure formed in advance on an upper surface of the wafer 110 placed on the electrode 111. However, a plasma processing method of the present embodiment is applicable not only to the microwave ECR etching apparatus. In addition, in order to clarify a mechanism of a first wafer effect, a residual gas in a chamber (processing chamber) is investigated by using a quadrupole mass spectrometer 180.

(Processing of Reference Example)

First, in order to describe the effect of the present embodiment, a processing flow of a reference example is shown in FIG. 2, and a relation between a wafer bias voltage (peak to peak voltage of radio frequency RF bias, Vpp) during a product etching step obtained by the processing flow of the reference example and a processing time is shown in FIG. 3. First, the processing flow of the reference example of FIG. 2 will be described.

The processing flow of the reference example is started after 5 minutes as an idle time during which the etching apparatus is not operated (the processing is suspended). Further, conditions for the product etching include a step of supplying $Cl_2$ gas/$NF_3$ gas to perform the etching and a step of supplying HBr gas/$CH_4$ gas/Ar gas to perform the etching. That is, the processing gas supplied to the inside of the processing chamber in the product etching step contains elements of C and H, or Cl.

The processing flow of the reference example of FIG. 2 includes a heating step S201, a first cleaning step S202, and a first coating step S203 before the product etching step. The heating step S201 is used to control a temperature of an inner wall of the chamber, and a condition and time are set so as to realize the temperature during mass-production processing. Here, in the etching apparatus of FIG. 1, the heating step S201 is carried out for a processing time of 120 seconds by supplying Ar gas from the gas supply device 132 at 180 cc/min and setting a microwave power to 1000 w.

The first cleaning step S202 is carried out to remove Si-based deposits and C-based deposits on the inner wall of the chamber. Further, in the first coating step S203, the Si-based deposits and the C-based deposits are attached to the inner wall to prevent the inner wall from being damaged and cover a particle source in the product etching step.

Next, the wafer 110 is transported to the processing chamber of the etching apparatus, a product etching step S204 is carried out, and after the processing is completed, the wafer 110 is transported from the processing chamber and taken out.

Then, a metal cleaning step S205 for removing a metal reaction product is carried out, then a second cleaning step S206 for removing a film deposited in the first coating step S203 and a reaction product generated in the product etching step S204 is carried out, and then a second coating step S207 is carried out.

After the second coating step S207 is carried out, the processing proceeds to the product etching step S204 again. Here, the product etching step S204, the metal cleaning step S205, the second cleaning step S206, and the second coating step S207 are repeated 25 times as one set, and finally, in a post cleaning step S208, the Si-based deposits, the C-based deposits, and a coating film on the inner wall of the chamber are removed to complete one lot of etching processing.

In this example, in the metal cleaning step S205, the processing is performed by using $BCl_3$ gas/$Cl_2$ gas. Further, in the first cleaning step S202, the second cleaning step S206, and the post cleaning step S208, the processing is performed by using $NF_3$ gas/Ar gas. In addition, in the first coating step S203 and the second coating step S207, the processing is performed by using $SiCl_4$ gas/$O_2$ gas.

FIG. 3 is a diagram showing the relation between the wafer bias voltage (Vpp) in the first three wafers in the lot and the processing time in the product etching step. According to FIG. 3, it is found that the wafer bias voltage of the first one (first) of the product lot and the wafer bias voltages of the second and third ones are different, and thus the product etching is unstable only for the first one.

(Processing of Present Embodiment)

FIG. 4 is a diagram showing a processing flow in the plasma processing method of the present embodiment. A difference from the processing flow of the reference example is that a gas-in step (first step) S401 is added before the heating step S201. That is, in the present embodiment, the heating step S201 of raising the temperature of the processing chamber, the first cleaning step S202 of removing the deposits in the processing chamber by using plasma, and the first coating step S203 of depositing a deposited film in the processing chamber are carried out after the gas-in step S401, and then the product etching step (second step) S204 is carried out. Further, the metal cleaning step S205 of removing metal-containing deposits, the second cleaning step S206 of removing the deposits in the processing chamber by using plasma, and the second coating step S207 of depositing a deposited film in the processing chamber are carried out after the product etching step S204, and then the post cleaning step S208 is carried out. Detailed description of the steps common to the steps in the reference example will be omitted.

The processing flow of the present embodiment shown in FIG. 4 will be described. Even in the processing flow of the present embodiment, similar to the processing flow of the reference example, the processing flow is started after 5 minutes as the idle time during which the etching apparatus is not operated. As a condition of the gas-in step S401, $Cl_2$ gas is supplied to the processing chamber as a residual adjusting gas at 300 cc/min for 15 seconds.

FIG. 5 is a diagram showing a relation between the wafer bias voltage (Vpp) during the product etching step obtained by the processing flow of the present embodiment and the processing time. As shown in FIG. 5, the wafer bias voltage of the first one (first) of the product lot coincides with the wafer bias voltages of the second and third ones of the product lot. In addition, in the reference example, it is shown that a difference in the wafer bias voltage is found between the first one of the product lot and the second and subsequent ones of the product lot, and it is also confirmed by the inventors that a plasma spectrum such as Si emission intensity is also changed.

Such first wafer effect is caused by changes in a chamber environment such as changes in the radical balance or ion balance, which can be improved by introducing the gas-in step. Further, the gas supplied in the gas-in step S401 is a gas containing a carbon element and a hydrogen element, a gas containing a chlorine element, or a mixed gas containing all of the gases used in the product etching step S204. The flow rate of the gas is preferably a flow rate obtained by a product of a flow rate specified in plasma processing conditions for each gas constituting the mixed gas and a predetermined ratio.

Next, in order to verify the improvement effect of such a first wafer effect, the residual gas is analyzed by using the quadrupole mass spectrometer 180.

FIGS. 6A to 6C are diagrams showing an evaluation flow in which the gas remaining in the chamber is mass-analyzed by using three types of processing flows in order to elucidate the mechanism. In these evaluation flows, in order to bring out the effect of idling as much as possible and avoid the effect of the residual gas, a mass analysis is carried out after the idle time of 12 hours or more before the start. Each processing flow will be described below.

FIG. 6A is a diagram of an evaluation flow which corresponds to the reference example in FIG. 2, after a lot pre-processing step (the heating step S201, the first cleaning step S202, and the first coating step S203) is carried out, the product etching step S204, the metal cleaning step S205, the second cleaning step S206, and the second coating step S207 are repeated 25 times as one set, and the residual gas during the mass-production processing is subjected to a mass analysis S601.

FIG. 6B is a diagram of an evaluation flow in which the residual gas is subjected to a mass analysis S602 immediately after the lot pre-processing step (the heating step S201, the first cleaning step S202, and the first coating step S203) is carried out.

FIG. 6C is a diagram of an evaluation flow which corresponds to a first embodiment of FIG. 4, the residual gas is subjected to a mass analysis S603 immediately after a lot pre-processing step including a gas-in step (the gas-in step S401, the heating step S201, the first cleaning step S202, and the first coating step S203) is carried out.

In the gas-in step S401, $Cl_2$ gas is supplied at 300 cc/min for 15 seconds. Here, if a result of the mass analysis S601 during the mass-production processing evaluated in the evaluation flow of FIG. 6A and a result of the mass analysis S602 evaluated in the evaluation flow of FIG. 6B are different, it is proved that a process variation is caused, and it is confirmed that the first wafer effect occurs.

As a result of analyzing these residual gases, the inventors have confirmed that a residue having a mass number of 36, at which the intensity changes remarkably, exists. FIG. 7 is a diagram showing a time transition on the intensity of the residue having a mass number of 36 obtained by the three types of evaluation flows of FIGS. 6A to 6C.

As shown in FIG. 7, an exceptionally high intensity of the residue having a mass number of 36 is confirmed during the mass-production processing (corresponding to the evaluation flow of FIG. 6A), and it is confirmed that the intensity reduces over a long period of time. On the other hand, it is found that the intensity of the residue having a mass number of 36 in the processing (corresponding to the evaluation flow of FIG. 6B) without the gas-in step is exceptionally lower than that during the mass-production processing.

Therefore, it is presumed that when an idle time, which is the non-operating time of the etching apparatus, increases, the first wafer effect occurs based on the change in the surface state of the processing chamber caused by the reduction of the residue having a mass number of 36.

On the other hand, by performing the processing (corresponding to the evaluation flow of FIG. 6C) including the gas-in step of the present embodiment, the intensity of the residue having a mass number of 36 is achieved at the level during the mass-production processing before the product processing step of the first one.

Further, HCl is shown as an example of the residue having a mass number of 36. Since $Cl_2$ gas is introduced in this gas-in step, the molecular species having a mass number of 36, which is increased by performing the processing including the gas-in step, is presumed to be HCl.

Further, since H is contained as a gas used for the product wafer, it is presumed that an adsorbent of H remains in the chamber and HCl is produced by reacting with H.

FIGS. 8A and 8B are schematic diagrams of an estimation model schematically showing a coat composition state in a coating film step caused by the change of the residue having a mass number of 36. FIG. 8A shows a case of the processing started without the gas-in step, and FIG. 8B shows a case of the processing started with including the gas-in step or a case during the mass-production processing.

Compared to the processing started without the gas-in step, it is known from the results of mass analysis that a large amount of residual Cl is found in the processing chamber in the processing started with the gas-in step or during the mass-production processing. Therefore, in the coating film step in which $SiCl_4$ gas/$O_2$ gas is introduced and plasma is used, a Cl-rich Si coating film is produced in the processing started with the gas-in step or during the mass-production processing (FIG. 8B).

On the other hand, in the process started without the gas-in step, an O-rich Si coating film is produced (FIG. 8A). Further, it is presumed that in the product etching step, the radical balance changes due to the influence of the composition state of these coating films.

Therefore, in order to improve the first wafer effect, it is necessary to stabilize the composition state of these coating films which affect the product etching step such that the composition state is always constant. That is, it is necessary to adjust a residual amount of the residue having a mass number of 36 after the coating step included in the lot pre-processing step to the level during the mass-production processing.

FIG. 9 shows a transition of a critical dimension (CD) value shown by the dimension of a certain line when the product etching is performed on one lot depending on the presence or absence of the condition for supplying $Cl_2$ gas at 300 cc/min for 15 seconds in the gas-in step in the processing flow of the reference example of FIG. 2 and the processing flow of the present embodiment of FIG. 4. In FIG. 9, numbers are sequentially given as wafer numbers, and for example, the wafer to be processed first in the lot is set to be 1, and the wafer to be processed next is set to 2 and so on.

The idle time before the processing is set to 12 hours in each case. A target dimension value of the CD is 10 nm, but in the reference example, the CD value of the first wafer of product lot processing varies to about 8 nm. However, by introducing the gas-in step of the present embodiment, it is possible to realize the CD value of about 10 nm as in the subsequent wafers even in the first wafer of product lot processing.

As described above, in a mass-production processing method of plasma etching which includes the coating step of attaching the Si-based or C-based deposits to the inner wall before the product etching step of plasma-processing the material to be processed, the metal cleaning step of removing a metal remaining on the inner wall of the processing chamber after the product etching step, the cleaning step of removing the Si and C-based deposits, and the coating step of then attaching the Si-based or the C-based deposit to the inner wall of the processing chamber again, and in which the product etching step, the cleaning step, and the coating step are repeated, by including the gas-in step of enabling gas to flow into the processing chamber without generating plasma before the coating step before the product etching step for the first one of lot processing, the amount of gas remaining in the chamber can be made the same as that during the mass-production processing before the product etching step for the first one of lot processing, and it is possible to improve the first wafer effect in the product etching step for the first one of lot processing.

Although in the present embodiment, since HCl remains in the chamber, an example of supplying $Cl_2$ gas as the gas in the gas-in step at 300 cc/min is shown, $C_3$ remains in the chamber in other product etching processes which mainly includes CH-based gas. $C_3$ also needs to be considered as a gas that easily remains in the chamber. In such a product etching process, it is confirmed that $CH_4$ gas/Ar gas is effective as the gas in the gas-in step.

Further, although in the present embodiment, the metal cleaning step S205 is carried out on the assumption that the product wafer contains metals such as Ti and Al, the metal cleaning step S205 may be omitted in a case where the metal is not contained.

Further, although in the present embodiment, the heating step S201 is carried out as a technique for raising the surface temperature of the processing chamber in the lot pre-processing step, in a case where the temperature may be raised by other techniques such as hardware or a process, a configuration including the heating step S201 is not necessarily used. In addition, the cleaning step is also not necessarily carried out.

In addition, although in the present embodiment, the description is made by using $SiCl_4$ gas/$O_2$ gas in the first coating step S203 and the second coating step S207, the technique of the gas-in step is also effective in a case where a carbon-based gas such as $CHF_3$, $CH_4$, $CH_3F$, and $C_4F_8$ is used. Further, although in the present embodiment, $NF_3$ gas/Ar gas is used in the first cleaning step S202 and the second cleaning step S206, an F-based or O-based gas which is effective for removing the Si-based or C-based film can be used as a substitute.

Further, in the present embodiment, the gas-in step S401 is carried out before the heating step S201. However, as a result of investigating a relation between an execution timing of the gas-in step S401 and the amount of residual gas with a mass analyzer, the inventors has confirmed that the gas-in step S401 is effective in reducing the first wafer effect since there is no significant difference in the residual level of the residue having a mass number of 36 immediately after any one of the heating step S201, the first cleaning step S202, and the first coating step S203. In addition, it is desirable that all the steps included in the lot pre-processing step shown in FIG. 4 are carried out without the wafer (without holding the wafer on the electrode 111). In addition, one of the reasons why plasma is not generated in the gas-in step is that the electrode is not damaged.

Second Embodiment

A sequence flow for further reducing the first wafer effect according to a second embodiment will be described. In the above first embodiment, a gas having a molecular species of a mass number of 36 is used as the gas in the gas-in step S401. Although in the process of the first embodiment, the gas residue having a mass number of 36 is the main component, depending on the type of gas used in the product etching step S204, it may be necessary to consider a gas residue other than the gas having a mass number of 36. In this case, it is effective if a part or all of the gas used in the product etching step S204 is used in the gas-in step S401.

Further, in a case where the idle time of the etching apparatus is long, that is, in a case where the gas is not used for a long time, gas accumulation may occur in an inner pipe of a mass flow controller (MFC). When the gas is then flowed, this stagnant gas may increase an initial gas flow rate by a few seconds. This matter may cause the process variation in the product etching step.

Therefore, the process variation due to the gas accumulation in the inner pipe of the mass flow controller is caused by a part or all of the gas used in the product etching step S204. In order to improve this matter, it is necessary to carry out the gas-in step S401 containing a part or all of the gas used in the product etching step S204 before the processing of the product etching step S204. Hereinafter, a specific example of the second embodiment for further reducing the first wafer effect will be shown.

FIG. 10 is an example of recipe setting in the gas-in step of the present embodiment. An example of the setting is described by taking, as an example, a case where in a product etching recipe S1001, the gas type and flow rate in step 1 are $Cl_2/NF_3/Ar$: 300/100/50 ccm, respectively, and the gas type and flow rate in step 2 are $CH_4/Ar$: 10/250 ccm, respectively. The gas used for the product etching which may cause the gas accumulation needs to be flowed in advance in the gas-in step S401. The inventors have confirmed that this matter can be sufficiently eliminated by making about 10% of the maximum flow rate of each gas during the product etching flow in the gas-in step for about 5 seconds or longer. At this time, a recipe S1002 of the gas-in step sets, for example, 10% of the maximum flow rate of each gas during all steps of the product etching recipe (steps 1 and 2 in the present embodiment), and the gas type and flow rate are $Cl_2/NF_3/CH_4/Ar$: 30/10/1/25 ccm, respectively. Here, it is necessary to consider the limitation of a MFC minimum flow rate S1004 and, for example, in a case where the limitation of the gas type and flow rate is $Cl_2/NF_3/CH_4/Ar$: 30/20/10/20 ccm, in a recipe S1003 of the gas-in step considering a MFC flow rate limitation, the gas type and flow rate are $Cl_2/NF_3/CH_4/Ar$: 30/20/10/25 ccm, respectively.

It is possible to prevent the process variation due to the gas accumulation in the inner pipe of the MFC by carrying out the gas-in step S401 set as described above. Further, it is also possible to reduce the process variation due to the residual gas described in the first embodiment and the beginning by making apart or all of the gas flow in the product etching step S204.

Third Embodiment

In addition, another problem that causes the process variation and a method for reducing the process variation will be described. FIG. 11 is a processing flow of a third embodiment for further reducing the first wafer effect. A temporal sequence of the heating step S201 and the gas-in step S401 in the processing flow of the first embodiment shown in FIG. 4 is reversed. Further, a metal cleaning step S1100, a third cleaning step S1101, and a third coating step S1102 are newly added before the gas-in step S401, and a metal cleaning step S1103 is added after the gas-in step S401.

It is desirable that the metal cleaning step S1100 has the same condition as the metal cleaning step S1103 after the gas-in step S401, the third cleaning step S1101 has the same condition as the first cleaning step S202 after the gas-in step S401, the third coating step S1102 has the same condition as the first coating step S203 after the gas-in step S401.

The effect of this processing flow will be described below. In a case where the idle time occurs, a film quality obtained by the third coating step S1102 may change, and the first wafer effect occurs. Therefore, by using the first cleaning step S1101, the third coating step S1102, and the gas-in step S401 that simulates the product etching step, it is possible to ensure the state of the wall surface of the processing chamber as if the first product etching step is completed.

As described above, in the mass-production processing method of plasma etching which includes the coating step of attaching the Si deposits or the C-based deposits to the inner wall of the processing chamber, the metal cleaning step of removing a metal remaining on the inner wall of the processing chamber after the product etching step, and the cleaning step of removing the Si deposits and the C-based deposits before the product etching step of plasma-processing the material to be processed, by including the gas-in step S401 of making gas flow into the processing chamber without generating plasma among the first metal cleaning step S1100, the third cleaning step S1101, the third coating step S1102 (a first treatment step), the second metal cleaning step S1103, the first cleaning step S202, the first coating step S203 (a second treatment step), and the first treatment process and the second treatment process before the product etching step for the first one of lot processing, the amount of gas remaining in the chamber can be made the same as that during the mass-production processing before the product etching step for the first one of lot processing, and it is possible to improve the first wafer effect in the product etching step for the first one of lot processing.

However, in this processing flow, since the cleaning step and the coating step are performed twice, the throughput is lowered. Therefore, it is preferable to separately use the processing of the first embodiment and the processing of the second embodiment according to situations. In addition, if the process does not require the cleaning of the metal reaction product, it is possible to omit a part or all of the metal cleaning steps S1100, S1103, S205.

Fourth Embodiment

A method for optimizing the gas-in step according to a fourth embodiment will be described. FIG. 12A is a diagram showing a relation between the residue having a mass number of 36 and the processing time when Cl₂ gas is supplied at 200 cc/min as a condition of the gas-in step S401 in the evaluation flow of FIG. 6C. The intensity of the residue having a mass number of 36 increased with an increase in the processing time.

FIG. 12B is a diagram showing a relation between the residue having a mass number of 36 and a gas flow rate when Cl₂ gas is supplied for 30 seconds as a condition of the gas-in step S401 in the evaluation flow of FIG. 6C. The intensity of the residue having a mass number of 36 increases with an increase in the gas flow rate.

According to these results, it is found that the gas flow rate and the processing time are control knobs (control factors) in order to stabilize the intensity of the residue having a mass number of 36 during the mass-production processing at an early stage. In other words, the gas that can stabilize the intensity of the residue having a mass number of 36 during the mass-production processing at an early stage with these control knobs may flow in the gas-in step. The gas supplied to the processing chamber in the gas-in step preferably includes at least a part of the gas supplied to the processing chamber during the product etching step. In addition, in order to further eliminate the influence of the stagnant gas described in the second embodiment, it is desirable to adjust the gas flow rate and time so as to match the intensity of the residual having a mass number of 36 based on setting a part or all of the gas in the product etching step S204 in the gas-in step S401.

REFERENCE SIGNS LIST

110: wafer
111: electrode
132: gas supply device
140: top plate
101: quartz-made shower plate
102: quartz-made inner tube
103: ground
142: electromagnet
150: radio frequency waveguide
161: RF bias power supply
162: matching machine
171: vacuum exhaust valve
180: quadrupole mass spectrometer
S201: heating step
S202: first cleaning step
S203: first coating step
S204: product etching step
S205: metal cleaning step
S206: second cleaning step
S207: second coating step
S208: post cleaning step
S401: gas-in step
S601: mass analysis
S602: mass analysis
S603: mass analysis
S1001: product etching recipe
S1002: recipe of the gas-in step
S1004: MFC minimum flow rate
S1100: metal cleaning step
S1101: third cleaning step
S1102: third coating step

12

S1103: metal cleaning step

The invention claimed is:

1. A plasma processing method in which a plurality of samples is processed in a processing chamber by using plasma, the plasma processing method comprising:
a first step of supplying a gas to the processing chamber; and
a second step of etching one of the plurality of samples by using plasma after the first step,
wherein the gas supplied in the first step comprises a gas containing a carbon element and a hydrogen element or a mixed gas containing all of the gases used in the second step, and the gas is not used for generating plasma,
wherein a wafer bias voltage during the second step of etching of a first one of the plurality of samples is equal to a wafer bias voltage during the etching of subsequent samples of the plurality of samples, and
wherein a flow rate of the gas is obtained by a product of a flow rate specified in a plasma processing condition for each gas constituting the mixed gas of the first step and a predetermined ratio.

2. The plasma processing method according to claim 1, further comprising:
a coating step of depositing a deposited film in the processing chamber; and
a cleaning step of removing a deposit in the processing chamber by using plasma, wherein
the coating step is performed between the first step and the second step, and
the cleaning step is performed after the second step.

3. The plasma processing method according to claim 2, further comprising:
a metal cleaning step of removing a metal-containing deposit, wherein
the metal cleaning step is performed between the second step and the cleaning step.

4. The plasma processing method according to claim 2, wherein
a heating step of raising a temperature of the processing chamber is performed before the second step, or the cleaning step is also performed before the second step.

5. The plasma processing method according to claim 1, wherein
the gas contains the carbon element and the hydrogen element.

6. The plasma processing method according to claim 1, further comprising:
a coating step of depositing a deposited film in the processing chamber; and
a cleaning step of removing a deposit in the processing chamber by using plasma, wherein
the coating step and the cleaning step are performed before the second step and before and after the first step.

7. The plasma processing method according to claim 1, wherein
an etching gas used in the second step contains a carbon element and a hydrogen element or a chlorine element.

8. The plasma processing method according to claim 1, wherein the gas is a methane gas.

* * * * *